(12) United States Patent
Nakamura

(10) Patent No.: US 8,720,045 B2
(45) Date of Patent: May 13, 2014

(54) APPARATUS FOR MOUNTING COMPONENTS ON A SUBSTRATE

(75) Inventor: Takeshi Nakamura, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/417,974

(22) Filed: Mar. 12, 2012

(65) Prior Publication Data

US 2012/0246929 A1    Oct. 4, 2012

(30) Foreign Application Priority Data

Mar. 31, 2011    (JP) ................................. 2011-077971

(51) Int. Cl.
*H05K 13/04*    (2006.01)

(52) U.S. Cl.
USPC .................. 29/740; 29/739; 29/741; 29/742; 29/705; 29/832

(58) Field of Classification Search
USPC ........... 29/739–743, 832–834, 705, 720–721; 269/266–267, 296–309
See application file for complete search history.

(56) References Cited

U.S. PATENT DOCUMENTS

| | | | |
|---|---|---|---|
| 5,400,497 A * | 3/1995 | Watanabe et al. | 29/705 |
| 6,695,298 B1 * | 2/2004 | Hertz et al. | 269/266 |
| 6,729,018 B1 * | 5/2004 | Takano et al. | 29/743 |
| 6,935,017 B2 * | 8/2005 | Hata et al. | 29/740 |
| 6,971,157 B1 * | 12/2005 | Yoshida et al. | 29/739 |
| 7,036,213 B2 * | 5/2006 | Kabeshita et al. | 29/740 |
| 2012/0246929 A1 * | 10/2012 | Nakamura | 29/834 |
| 2012/0249772 A1 * | 10/2012 | Nakamura | 348/94 |
| 2012/0253499 A1 * | 10/2012 | Nakamura | 700/121 |

FOREIGN PATENT DOCUMENTS

JP    2002-208797    7/2002

* cited by examiner

*Primary Examiner* — Minh Trinh
(74) *Attorney, Agent, or Firm* — K&L Gates LLP

(57) ABSTRACT

A component mounting device which is provided with a transport unit which has a transport region and transports a substrate in the transport region; a plurality of supply regions which are lined up along the transport direction of the substrate due to the transport unit and are able to supply each component; a control unit which sets a mounting region which is a region where the component is mounted in the transport region of the transport unit according to the disposing of the supply region of the component which is necessary for the substrate out of the plurality of supply regions; and a mounting unit which takes out the component which is necessary for the substrate from at least one supply region out of the plurality of supply regions and performs mounting the component on the substrate in the mounting region which has been set.

7 Claims, 7 Drawing Sheets

APPARATUS FOR MOUNTING COMPONENTS ON A SUBSTRATE

CROSS REFERENCES TO RELATED APPLICATIONS

The present application claims priority to Japanese Priority Patent Application JP 2011-077971 filed in the Japan Patent Office on Mar. 31, 2011, the entire content of which is hereby incorporated by reference.

BACKGROUND

The present application relates to a component mounting device and a substrate manufacturing method which mount a component on a substrate.

A component mounting device is typically a device in which a head takes out an electronic component by accessing a feeder which supplies the electronic component and mounts the electronic component on a circuit substrate or the like which is positioned in a region for mounting.

In Japanese Unexamined Patent Application Publication No. 2002-208797, a substrate transport method in a component mounting device is disclosed. In the component mounting device, for example, four stages which hold a circuit substrate and perform a mounting operation are lined up in one row on a transport line and are lined up in order of a first, second, third, and fourth stage from the upstream side of the transport line. These stages are able to move in a direction which is orthogonal to the transport line so as to be removed from the transport line and the mounting operation is performed at a destination which has been moved. The circuit substrate which is held by each of these stages is transported in synchronization on the transport line.

In the substrate transport method, for example, in a case where the mounting at the second stage is complete and the circuit substrate is not held at the third stage, the circuit substrate which is at the second stage is transported by itself to the third stage without waiting for the completion of mounting at the first and fourth stages. Due to this, throughput is improved (for example, refer to paragraph [0024] in the specifications of Japanese Unexamined Patent Application Publication No. 2002-208797).

SUMMARY

In this manner, the performing of the mounting process as efficiently as possible and the improvement in productivity are demanded in the component mounting device.

It is desirable that a component mounting device and a substrate manufacturing method are proposed which are able to achieve efficiency in the processing time and improve the productivity of the product.

According to an embodiment of the present application, there is provided a component mounting device which includes a transport unit, a plurality of supply regions, a control unit, and a mounting unit.

The transport unit has a transport region and transports a substrate in the transport region.

The plurality of supply regions are lined up along the transport direction of the substrate due to the transport unit and are able to supply each component.

The control unit sets a mounting region which is a region where the component is mounted in the transport region of the transport unit according to the disposing of the supply region of the component which is necessary for the substrate, out of the plurality of supply regions.

The mounting unit takes out the component which is necessary for the substrate from at least one supply region out of the plurality of supply regions and performs mounting the components on the substrate in the mounting region which has been set.

The control unit is able to set the mounting region where the mounting unit is able to move in a time efficient manner since the mounting region is set in the transport region of the transport unit according to the disposing of the supply region which is necessary for the substrate. Due to this, it is possible to achieve efficiency in processing time and improve the productivity of the product.

The control unit may set the mounting region according to the disposing of the plurality of supply regions as the supply region of the component which is necessary for the substrate. In this case, the mounting unit mounts the component on the substrate by taking out each component which is necessary for the substrate from the plurality of supply regions.

The control unit may further set the mounting region based on the number of each component which is taken out from each of the plurality of supply regions by the mounting unit. Due to this, the control unit is able to set the mounting region in a position where the movement distance and the movement time of the mounting unit is shortened as much as possible.

In this case, the control unit may set the position of the mounting region so as to allot such that the mounting region corresponds to the ratio of the number of each component with a central position between the plurality of supply regions in the transport direction as a reference.

The plurality of supply regions may supply each of a plurality of components which are different or may supply a plurality of the same components.

The component mounting device may be further provided with a backup member which has a support section, which is provided to be able to elastically change shape and which supports the substrate, and which is disposed in the mounting region. By the backup member which is able to elastically change shape being provided, it is possible for the pressing force on the substrate to be relived even in a case where the substrate is supported by the backup member in any position and accurate positioning of the backup member corresponding to the mounting region is not necessary.

The backup member has a longer size in the transport direction than the mounting region. As described above, it is possible for the backup member to be a fixed member (in a stationary state) in the transport direction by the accurate positioning of the backup member for each change in the mounting region not being necessary and the backup member having a longer size in the transport direction than the mounting region.

According to another embodiment of the present application, there is provided a substrate manufacturing method using a component mounting device which is provided with a transport unit which has a transport region and transports a substrate in the transport region and a plurality of supply regions which are lined up along the transport direction of the substrate due to the transport unit and are able to supply each component.

A mounting region which is a region where the component is mounted is set in the transport region of the transport unit according to the disposing of the supply region of the component which is necessary for the substrate out of the plurality of supply regions.

The component which is necessary for the substrate is taken out from at least one of the supply regions out of the plurality of supply regions and mounting of the component is performed on the substrate in the mounting region which has been set.

Above, according to the embodiments of the present application, it is possible to achieve efficiency in the processing time and improve the productivity of the product.

Additional features and advantages are described herein, and will be apparent from the following Detailed Description and the figures.

DETAILED DESCRIPTION

Below, embodiments of the present application will be described while referencing the diagrams.

Configuration of Component Mounting Device

Figure 1:
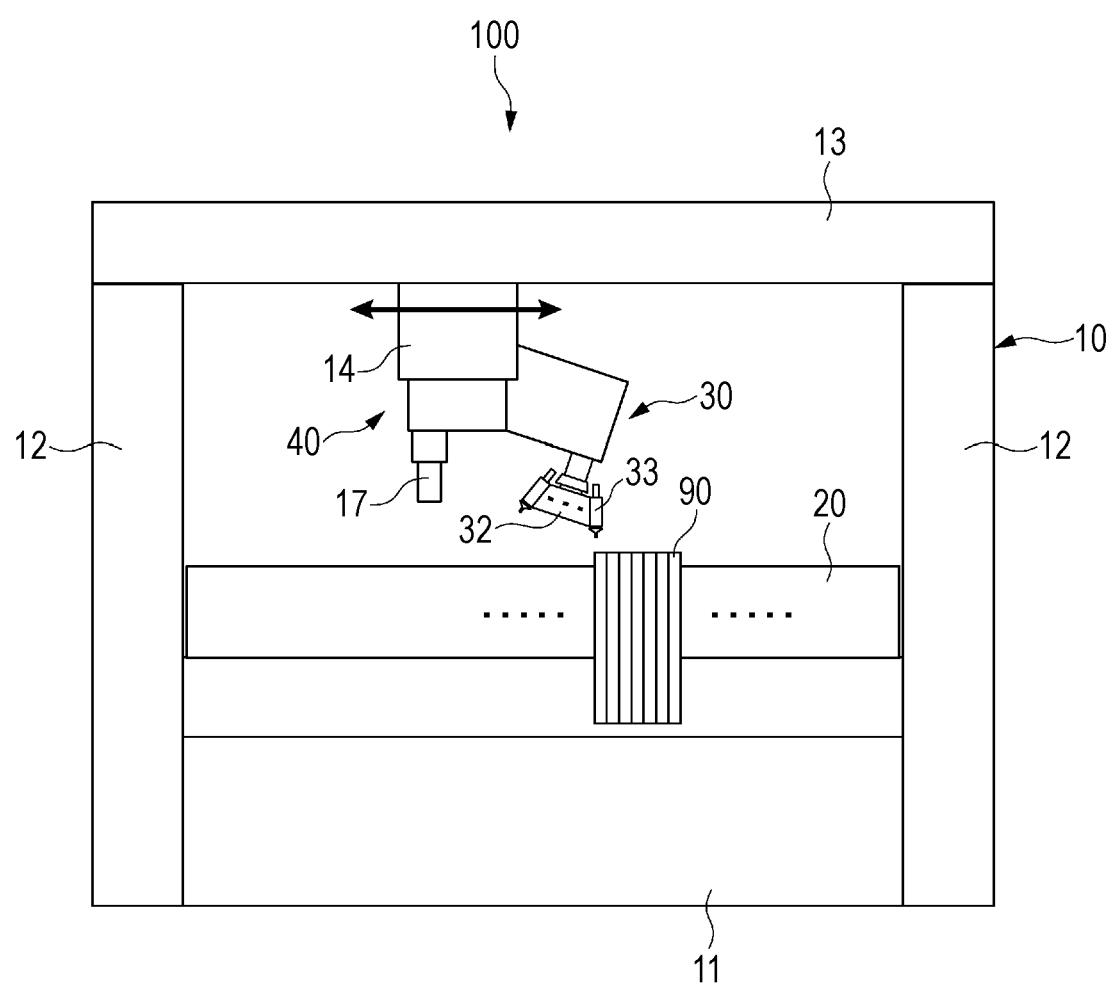
FIG. 1 is a front view illustrating in a schematic manner a component mounting device according to a first embodiment of the present application.
Figure 2:
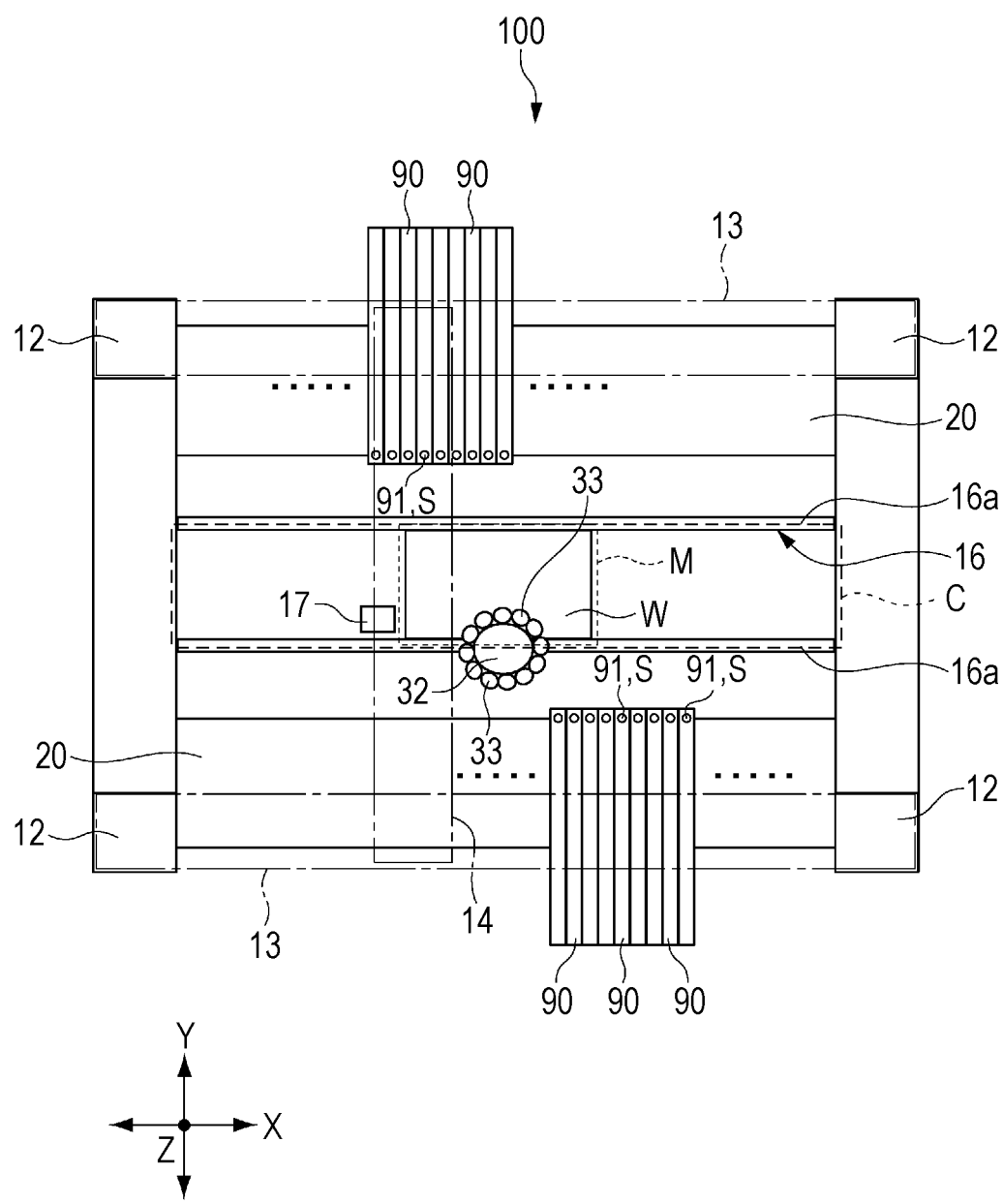
FIG. 2 is a top view of the component mounting device which is shown in FIG. 1.
Figure 3:
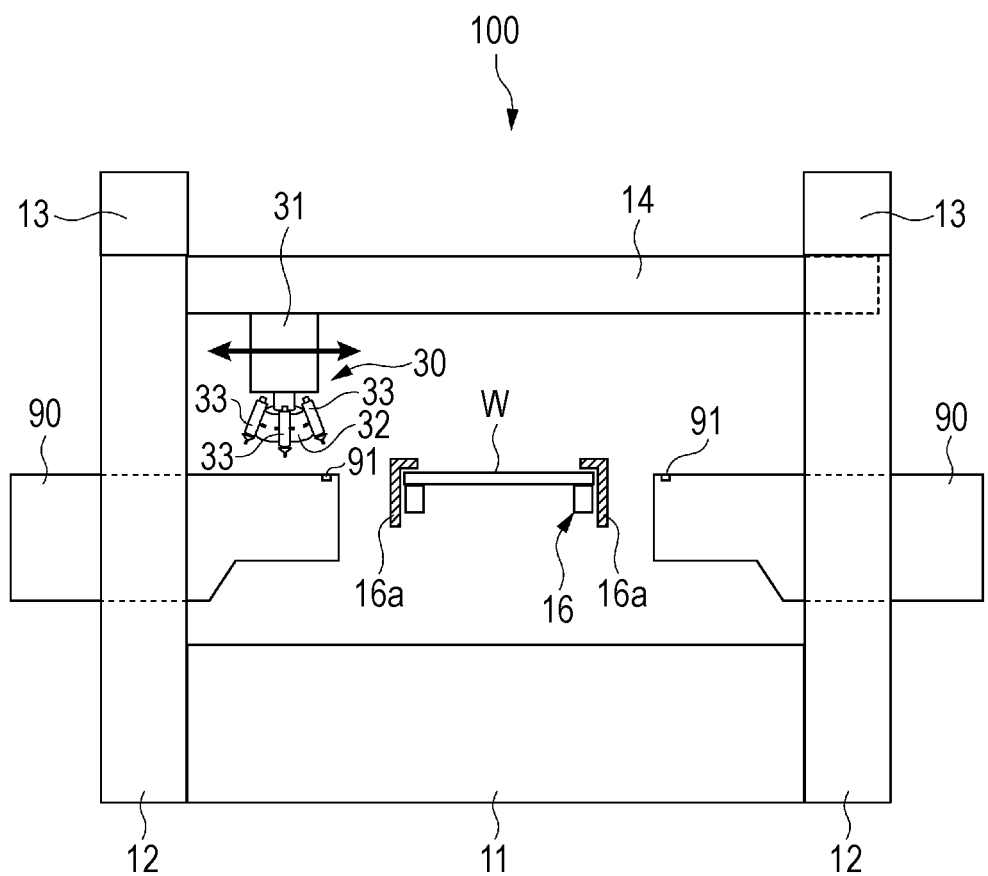
FIG. 3 is a side view of the component mounting device which is shown in FIG. 1.

FIG. 1 is a front view illustrating in a schematic manner a component mounting device according to a first embodiment of the present application. FIG. 2 is a top view of a component mounting device 100 which is shown in FIG. 1, and FIG. 3 is a side view thereof.

The component mounting device 100 is provided with a frame 10, a mounting head 30 which holds a component which is not shown and mounted the component on a circuit substrate (referred to below simply as a substrate) W which is a mounting target, a tape feeder installation section 20 where a tape feeder 90 is installed, and a transport unit 16 (refer to FIG. 2) which holds and transports the substrate W.

The frame 10 has a base 11 which is provided on a bottom portion and a plurality of supporting pillars 12 which are fixed to the base 11. In the upper portion of the plurality of supporting pillars 12, for example, two X beams 13 which span along the X axis in the diagram are provided. For example, between the two X beams 13, a Y beam 14 spans along the Y axis and the mounting head 30 is connected to the Y beam 14. In the X beams 13 and the Y beam 14, an X axis movement structure and a Y axis movement structure which are not shown are provided, and as such, it is possible for the mounting head 30 to move along the X axis and the Y axis. The X axis movement structure and the Y axis movement structure are typically configured using a ball screw driving structure, but other structures such as a belt driving structure may be used.

A mounting unit 40 is configured from the mounting head 30, the X axis movement structure, and the Y axis movement structure. There are cases where a plurality of the mounting units 40 are provided mainly in order to improve efficiency, and in this case, the plurality of mounting heads 30 are driven in the X and Y axial directions independently.

As shown in FIG. 2, the tape feeder installation section 20 is disposed on both the front portion side (lower side in FIG. 2) and the rear portion side (upper side in FIG. 2) of the component mounting device 100. The Y axial direction in the diagram is the front and back direction of the component mounting device 100. In the tape feeder installation section 20, a plurality of the tape feeders 90 are installed so as to line up along the X axial direction. For example, it is possible for 40 to 70 of the tape feeders 90 to be installed on the tape feeder installation section 20. In the embodiment, it is possible for 58 of the tape feeders 90 on each of the front portion and the rear portion, a total of 116, to be installed. One of the tape feeders 90 is able to contain, for example, approximately 100 to 10000 electronic components.

Here, the tape feeder installation section 20 is configured to be provided on both the front portion side and the rear edge side of the component mounting device 100, but the tape feeder installation section 20 may be configured to be provided on either one the front edge side or the rear portion side.

The taper feeder 90 is formed to be long in the Y axial direction. The details of the tape feeder 90 are not shown in the diagram, but a reel is provided and carrier tape which contains an electronic component such as a condenser, a resistor, an LED, or an IC packaging is wound on the reel. In addition, the tape feeder 90 is provided with a structure for feeding out the carrier tape by step feeding and the electronic components are supplied one at a time for each of the step feeds. As shown in FIG. 2, a supply window 91 is formed in the upper surface of the edge portion of a cassette of the tape feeder 90, and the electronic component is supplied via the supply window 91. A region, where a plurality of the tape feeders 90 are formed along the X axial direction by being lined up and a plurality of the supply windows 91 are each lined up, is an electronic component supply region S. That is, the plurality of supply regions S is lined up in a straight line along the transport direction of the substrate W.

Here, in the carrier tape of one of the tape feeders 90, a plurality of the same electronic component is contained. There are cases where the same electronic component is contained over a plurality of the tape feeders 90 out of the tape feeders 90 which are mounted on the tape feeder installation section 20.

The transport unit 16 described above is provided in the central portion of the component mounting device 100 in the Y axial direction, and the transport unit 16 transports the substrate W along the X axial direction. The transport unit 16 has a transport region C as a region where the substrate W is transported. For example, as shown in FIG. 2, a region on the substrate W, which is supported by the transport unit 16 in substantially the central portion on the transport unit 16 in the X axial direction, is a mounting region M where the mounting of the electronic component is performed due to accessing by the mounting head 30. As will be described later, the mounting region M is set in the transport region C and the position of the mounting region is able to be changed.

The mounting head 30 is provided with a carriage 31 which is connected to the Y axis movement structure of the Y beam 14, a turret 32 which is provided so as to extent diagonally downward from the carriage 31 as a rotational body, and a plurality of suction nozzles 33 which is attached along the circumference direction of the turret 32. The suction nozzles 33 function as holding bodies which take out and hold the electronic component from the carrier tape due to a vacuum suction action. The suction nozzles 33 are able to move up and down so as to mount the electronic component on the substrate W. For example, 12 of the suction nozzles 33 are provided.

The mounting head 30 is able to move in the X and Y axial directions as described above, the suction nozzles 33 move between the supply region S and the mounting region M, and in addition, moves in the X and Y axial directions in the mounting region M so as to execute the mounting in the mounting region M.

The turret 32 is able to rotate (spin) with a shaft in a diagonal direction as the central rotation shaft. The suction nozzles 33 which are disposed so that the length direction of the suction nozzles 33 is along the Z direction out of the plurality of suction nozzles 33 are the suction nozzles 33 which are selected for mounting the electronic component on the substrate W. An arbitrary one of the suction nozzles 33 is selected using the rotation of the turret 32. The electronic component is suction and held by the suction nozzles 33 which have been selected accessing the supply window 91 of the tape feeder 90 and the electronic components are mounted on the substrate W by being moved and lowered to the mounting region M.

The mounting head 30 holds each of a plurality of the electronic components continuously in one process with the plurality of suction nozzles 33 while the turret 32 rotates. In addition, the electronic components which are suctioned by the plurality of suction nozzles 33 are mounted on one substrate W continuously in one process.

As shown in FIG. 1, the substrate camera 17 which detects the position of the substrate W is attached in the mounting head 30. The substrate camera 17 is able to move integrally with the mounting head 30 using the X axis and Y axis movement structures. The substrate camera 17 is disposed in an upper portion of the transport unit 16 and images an image of the substrate W from the upper portion side when the position of the substrate W is detected. The substrate camera 17 recognizes an alignment mark (not shown) which is provided on the substrate W and the mounting unit 40 mounts the electronic component on the substrate W with the alignment mark as the reference position.

The transport unit 16 is typically a belt type of conveyer, but is not limited to this and any be any of a roller type, a type where a support mechanism which supports the substrate W moves by sliding, a non-contact type, or the like. The transport unit has a guide rail 16a which is provided along the X axial direction. Due to this, there is transportation with deviation in the Y axial direction of the substrate W which is transported being regulated.

Figure 4:
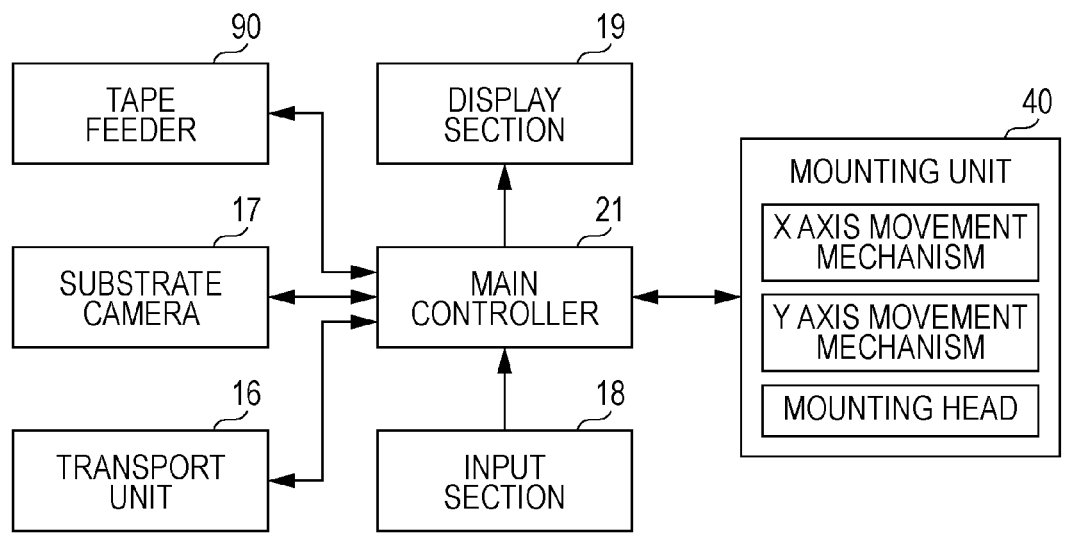
FIG. 4 is a block diagram illustrating a configuration of a control system of a component mounting device.

FIG. 4 is a block diagram illustrating a configuration of a control system of the component mounting device 100.

The control system has a main controller 21 (or a host computer). In the main controller 21, the tape feeder 90, the substrate camera 17, the transport unit 16, the mounting unit 40, an input section 18, and a display section 19 are electrically connected.

The tape feeder 90 has a built-in memory which is not shown. The built-in memory is electrically connected to the main controller 21 by the tape feeder 90 being set in the tape feeder installation section 20. In the built-in memory, information on the electronic component which is contained in the tape feeder 90 is stored in advance. Due to this, the main controller 21 stores which of the tape feeders 90 which has which type of the electronic component is set in which position in the tape feeder installation section 20. The information on the electronic component is information such as the type of the electronic component or the number of the electronic components which the tape feeder 90 has.

Alternatively, the information on which of the tape feeders 90 which has which type of the electronic component is set in which position in the tape feeder installation section 20 may be input into the main controller 21 via the input section 18 manually by an operator.

In each of the movement structures and the mounting head 30 of the mounting unit 40, motors (not shown) which are installed therein and drivers which drive each of the motors are provided. The drivers drive each of the movement structures and the mounting head 30 according to control signals due to the main controller 21 outputting the control signals to the drivers.

The input section 18 is a device which, for example, is operated by the operator for the operator to input information which is necessary for the mounting process such as the type of the substrate W which is the mounting target to the main controller 21. The display section 19 is a device which, for example, displays information which is input via the input section 18 by the operator, information which other information which is necessary.

The main controller 21 has, for example, a function of a computer such as a CPU, a RAM, and a ROM and functions as a control unit. The main controller 21 may be realized by a device such as a PLD (Programmable Logic Device) such as a FPGA (Field Programmable Gate Array) or another ASIC (Application Specific Integrated Circuit).

Below, a mounting region setting method of a mounting region M will be described.

Mounting Region Setting Method of First Embodiment

Figure 5:
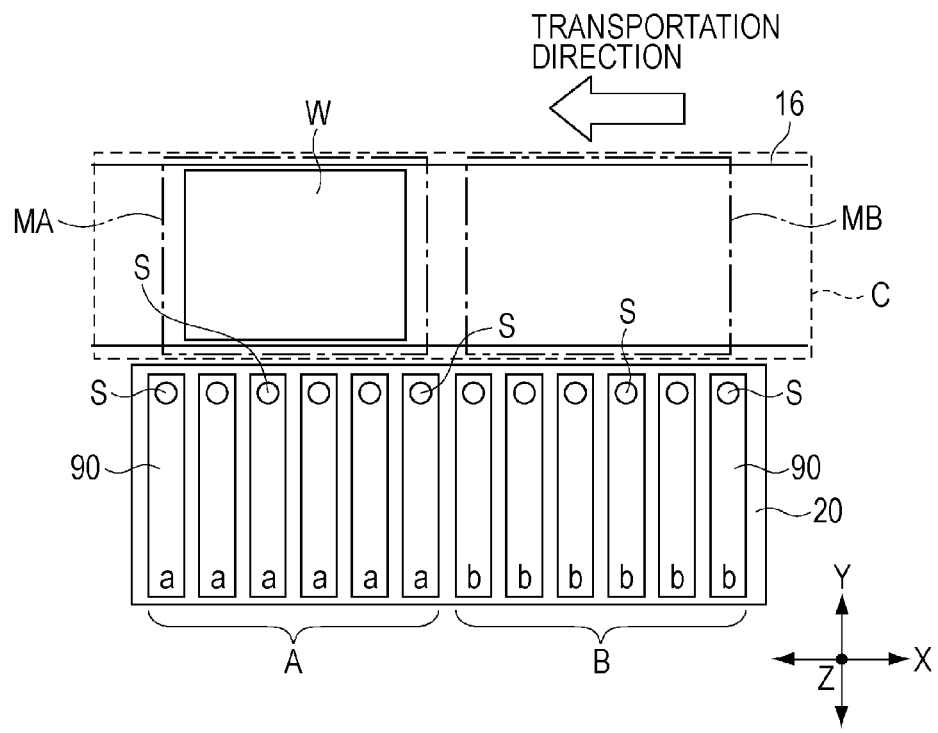
FIG. 5 is a schematic diagram for describing a mounting region setting method according to the first embodiment of the present application.
Figure 6:
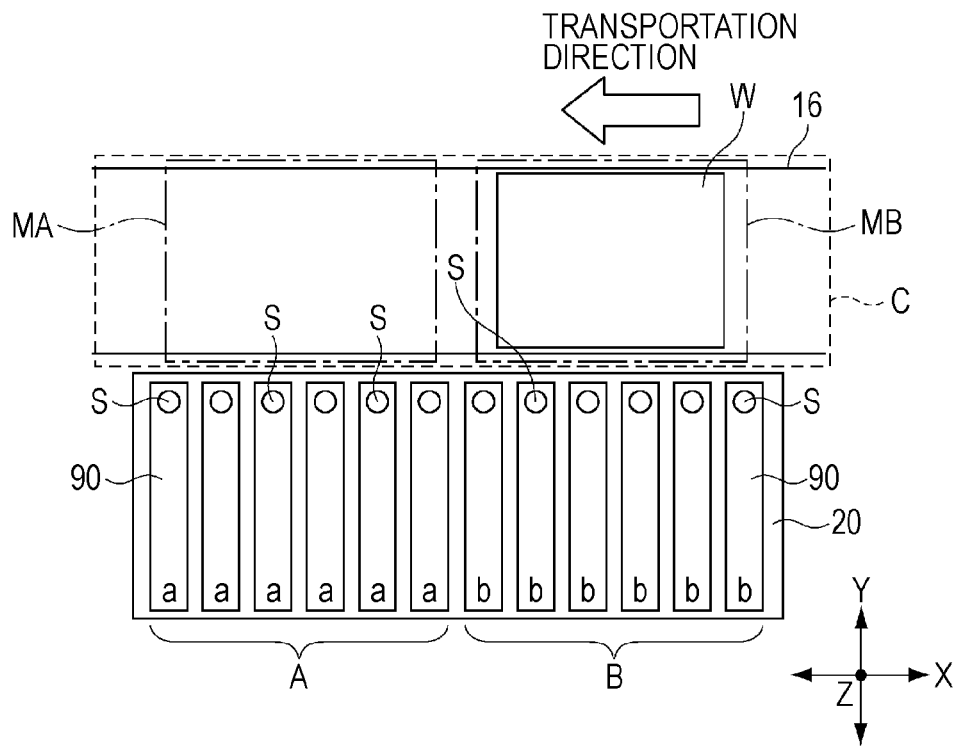
FIG. 6 is a schematic diagram for describing a mounting region setting method according to the first embodiment of the present application.

FIGS. 5 and 6 are schematic diagrams for describing a mounting region setting method according to the first embodiment of the present application. In the description below, the electronic component will simply be referred to as the "component".

In the embodiment, two mounting regions MA and MB which do not overlap are set in advance along the transport direction (X axial direction).

The transport direction of the substrate W is a direction from right to left in the diagram. In the tape feeder installation section 20, 12 of the tape feeders 90 are disposed.

Six of the tape feeders 90 which supply a component a (referred to below as a group A) are disposed in the downstream side in the transport direction. In addition, six of the tape feeders 90 which supply a component b which is different to the component a (referred to below as a group B) are disposed in the upstream side.

The difference between the component a and the component b is as follows. For example, the difference is a difference in that the component a is a resistor and the component b is a condenser. Alternatively, the difference is a difference in that the component a is a 10 kΩ resistor and the component b is a 1 kΩ resistor.

In the embodiment, the mounting region MA is provided at the downstream side of the transport region C and is typically provided in a region which is adjacent to the supply region S of the tape feeders 90 of the group A in the Y axial direction. The mounting region MB is provided at the upstream side of the transport region C and is typically provided in a region which is adjacent to the supply region S of the tape feeders 90 of the group B in the Y axial direction.

The main controller 21 selects either one out of the mounting region MA or MB according to the disposing of (tape feeder 90 which has) the supply region S of the component which is necessary for the substrate W which is the mounting target and sets the mounting region as the transport region C.

Each of the tape feeders 90 of the group A and the group B are set by an operator and the operator inputs information which is necessary to the main controller 21 via the input section 18. Due to this, as described above, the main controller 21 recognizes information on the disposing of the tape feeders 90 of the group A and the group B which respectively contain the components a and b.

<First Pattern>

A first pattern is a pattern where only a plurality of the components a are mounted on one substrate W.

In the first pattern, as shown in FIG. 5, the main controller 21 sets the mounting region as the region MA.

When the mounting region MA is set, the transport unit 16 stops the substrate W which is transported in the mounting region MA. Then, the component a is taken out by the mounting head 30 accessing one or a plurality of the supply regions S in the group A and the component a is mounted on the substrate W which is disposed in the mounting region MA.

In a case where the number of the components a which are necessary for the substrate W is larger than the number of suction nozzles 33 (for example, 12), the mounting head 30 mounts the components a by repeating the action described above. That is, the mounting head 30 repeats the movement between the supply region S in the group A and the mounting region MA.

<Second Pattern>

A second pattern is a pattern where only a plurality of the components b is mounted on one substrate W.

In the second pattern, as shown in FIG. 6, the main controller 21 sets the mounting region as the region MB.

When the mounting region MB is set, the transport unit 16 stops the substrate W which is transported in the mounting region MB. Then, the component b is taken out by the mounting head 30 accessing one or a plurality of the supply regions S in the group B, and the component b is mounted on the substrate W which is disposed in the mounting region MB.

In a case where the number of the components b which are necessary for the substrate W is larger than the number of suction nozzles 33 (for example, 12), the mounting head 30 mounts the components b by repeating the action described above. That is, the mounting head 30 repeats the movement between the supply region S in the group B and the mounting region MB.

<Third Pattern>

A third pattern is a pattern where a plurality of the components a and one or a plurality of the component b which is a number less than the number of components a is mounted on one substrate W.

In the third pattern, as shown in FIG. 5, the main controller 21 sets the mounting region as the region MA.

In a case where the number of the components a which are necessary for the substrate W is larger than the number of suction nozzles 33 (for example, 12), the mounting head 30 repeats the movement between one or a plurality of the supply regions S in the group A and the mounting region MA. Next, the component b is taken out by the mounting head 30 accessing one or a plurality of the supply regions S in the group B and the component b is mounted on the substrate W which is disposed in the mounting region MA.

Here, with regard the order of the mounting of the components a and b, the component b may be first and the component a may be next.

<Fourth Pattern>

A fourth pattern is a pattern where one or a plurality of the components a and a plurality of the component b which is a number more than the number of components a is mounted on one substrate W.

In the fourth pattern, as shown in FIG. 6, the main controller 21 sets the mounting region as the region MB.

In a case where the number of the components b which are necessary for the substrate W is larger than the number of suction nozzles 33 (for example, 12), the mounting head 30 repeats the movement between one or a plurality of the supply regions S in the group B and the mounting region MB. Next, the component a is taken out by the mounting head 30 accessing one or a plurality of the supply regions S in the group A and the component a is mounted on the substrate W which is disposed in the mounting region MB.

Here, with regard the order of the mounting of the components a and b, the component a may be first and the component b may be next.

As in each of the patterns, the main controller 21 sets the mounting region M in a region which is adjacent to the supply regions S where there are a large number of components which are supply targets according to the disposing of the supply region S which is necessary for the substrate W. That is, the main controller 21 is able to select and set the mounting region M where the mounting head 30 is able to move in a more time efficient manner. Due to this, it is possible to achieve efficiency in the processing time and improve the productivity of the product.

In addition, the present application is particularly appropriate for production of a large variety of products in small lots. In the case of production of a large variety of products in small lots, the type of substrate and the type of components are numerous and the number of substrates which are produced is comparatively small. In a case such as this, in a case where the present application is not used, it is necessary for the operator to perform "set-up change" where the tape feeders 90 are set and the like for each of the types of substrate which is the mounting target. Accordingly, the proportion which the time necessary for set-up change takes up in the production time (processing time) increases.

However, according to the embodiment of the present application, if each of the tape feeders 90 which contain the components which are necessary for each of the large variety of substrates W are set in the tape feeder installation section 20 in advance, it is possible for the component mounting device 100 to automatically set the optimal mounting region M for each of the types of substrate. Due to this, it is possible for the proportion which the time necessary for set-up change takes up in the production time to be reduced and it is possible for productivity to be improved. The characteristic effect using the present application in this manner is particularly large in a third embodiment which will be described later.

In the first embodiment, the two mounting regions MA and MB are set in advance, but three or more mounting regions which do not overlap or three or more mounting regions which do overlap may be set in advance. Whether or not the mounting regions overlap depends on the conditions of the length of the transport region C in the transport direction, the length of the mounting region M in the transport direction, and the like.

Mounting Region Setting Method of Second Embodiment

Figure 7:
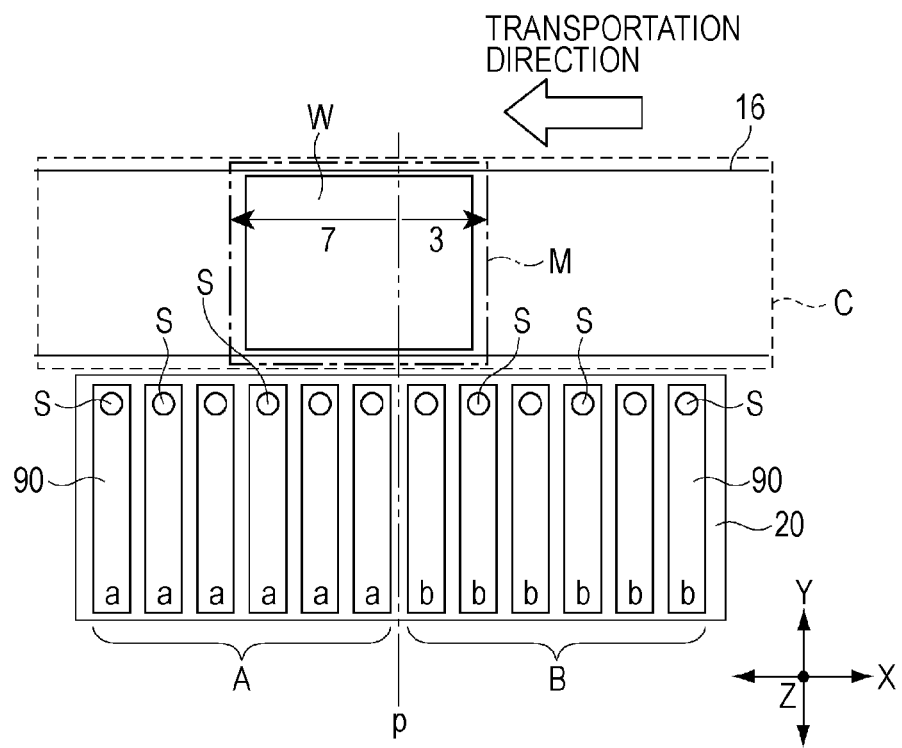
FIG. 7 is a schematic diagram for describing a mounting region setting method according to a second embodiment of the present application.

FIG. 7 is a schematic diagram for describing a mounting region setting method according to a second embodiment of the present application. In the description from here, the description of the portions which are similar to the embodiment which is shown in FIGS. 5 and 6 are simplified or omitted and the points which differ are the focus of the description.

For example, the main controller 21 sets the position of the mounting regions M in the transport region C so as to allot so that the length of the mounting region M in the transport direction corresponds to the ratio of the number of each of the components a and b with the central position between the plurality of supply regions S in the transport direction (here, the groups A and B) as a reference.

In the example of FIG. 7, for example, the ratio of the number of the components a and b which are necessary for the substrate W is approximately 7:3. In this case, the main controller 21 sets the mounting regions M so as to dispose so that the length of the mounting region M in the transport direction is a ratio where the position which is adjacent to the group A is 7 and the position which is adjacent to the group B is 3 with a boundary line p between the groups A and B are a center point.

Figure 8:
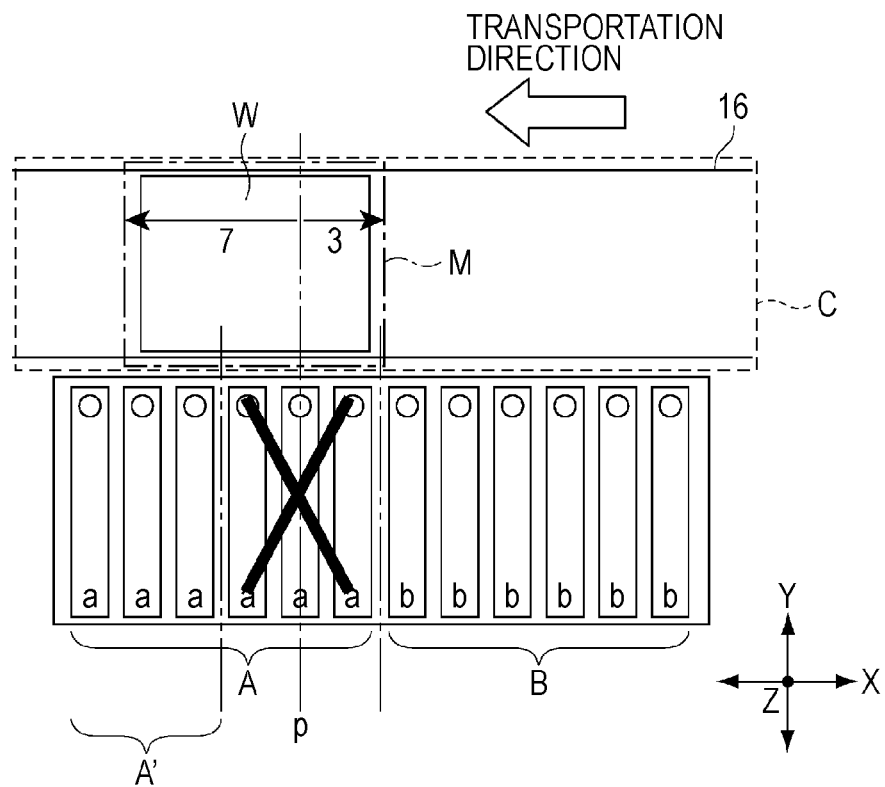
FIG. 8 is a schematic diagram for describing a mounting region setting method according to the second embodiment of the present application.

As another example, in the example of FIG. 8, three tape feeders 90 on the upstream side out of the six tape feeders 90 of the group A are shown as being open. In this case, the central boundary p between the region (group A') where the three remaining tape feeders 90 at the downstream side are disposed and the group B is a reference in the transport direction. The main controller 21 sets the position of the mounting region M so as to allot the mounting region to correspond to the ratio of the number of each of the components a and b with the central position p as the reference. In the case of this example, the ratio of the components a and b which are necessary for the substrate is also 7:3.

According to the mounting region setting method of the second embodiment such as this, since the mounting region is set according to the ratio of the number of components which are necessary for the substrate W, it is possible for efficiency in the processing time to be further achieved.

In the second embodiment, there is setting where the mounting region M is allotted using the ratio according to the ratio of the number of each of the components. However, the allotment of the mounting region M may be determined in advance as a plurality of combinations of ratios. For example, the allotment ratios of "1:4 (4:1), 1:3 (3:1), 1:1" and the like may be set in advance as the plurality of combinations of ratios (for example, three combinations). Then, the main controller 21 may select the ratio where the processing efficiency is the highest out of the ratios. In addition, this embodiment and an embodiment, where three or more mounting regions which do not overlap or three or more mounting regions which overlap are set in advance as described above, may be combined.

Here, the principle of the setting method of the second embodiment is the same as a case where there is only one supply region S in the group A and there is only one supply region S in the group B. The central position of the two supply regions S is the reference.

Mounting Region Setting Method of Third Embodiment

Figure 9:
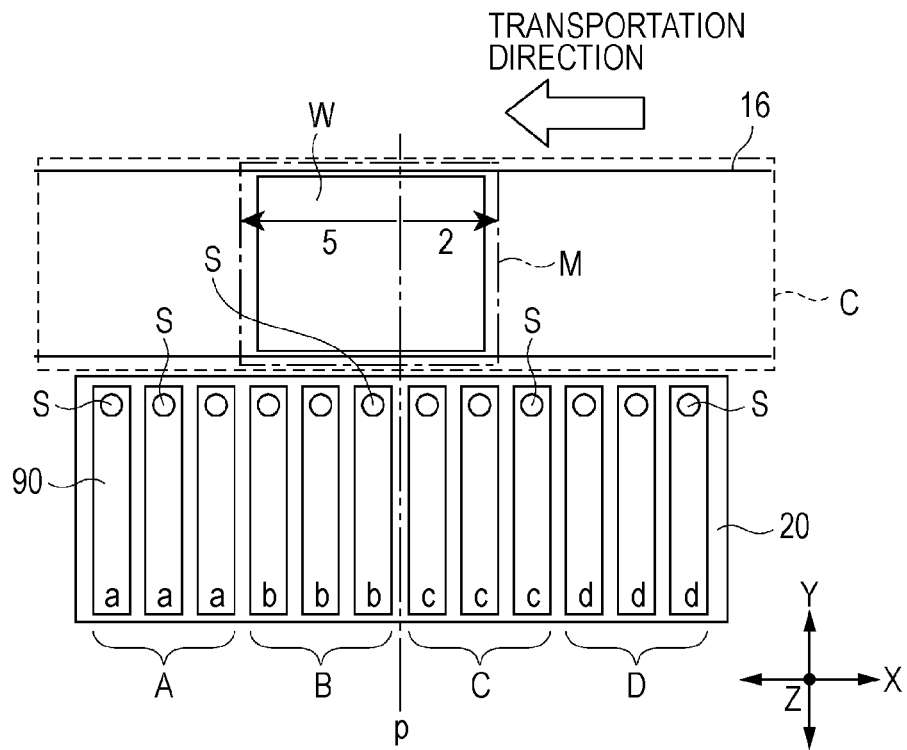
FIG. 9 is a schematic diagram for describing a mounting region setting method according to a third embodiment of the present application.

FIG. 9 is a schematic diagram for describing a mounting region setting method according to a third embodiment of the present application. In the example, a case is shown where the components which are necessary for the substrate W which is the mounting target are three types or more. For example, there are four components a, b, c, and d which are different and the tape feeders 90 in groups A, B, C, and D respectively supply each of the components. Three tape feeders 90 are provided for each of the groups A, B, C, and D.

The central position p of the groups A, B, C, and D in the transport direction is the reference. As one example, the mounting region M is allotted in the transport direction using the total of the numbers of the ratios of the components a and b and the total of the numbers of the ratios of the components c and d. For example, in a case where the ratio of the numbers of the components a to d which are necessary for the substrate W is 2:3:1:1, there are setting where the length of the mounting region M in the transport direction is allotted using the ratio of 5:2 ((2+3):(1+1)) with the central position p as the reference.

Alternatively, the mounting region M may be allotted in the transport direction using the ratio of 6:1 ((2×3):(1×1)) with the central position p as the reference.

Alternatively, the mounting region M may be allotted in the transport direction using the ratio of (number of components a and the number of components b necessary for the substrate W):(number of components b and the number of components b necessary for the substrate W) with the central position p as the reference.

Alternatively, the main controller 21 may perform weighting with regard to the groups A and D which are in positions which are separated from the central position p compared to the groups B and C. That is, a coefficient according to the separation from the central position p is multiplied to the number of the ratio. Since the movement distance of the mounting unit 40 is longer as the distance from the central position p is longer, the extent of this is taken into consideration in the calculating the allotment of the mounting region M. In the example described above, there is a state where a coefficient such as 1.3 or the like is multiplied to each of the numbers of "2" and "1" of the ratio of the components a and d which respectively correspond to the groups A and D. The main controller 21 may store the coefficient such as this according to the distance in a lookup table format in advance or may calculate using a calculation each time using a predetermined algorithm.

In this manner, the main controller 21 is able to set the mounting region, where the mounting unit 40 is able to move in a time efficient manner, in the transport region C according to the disposing of each of the supply regions S of the components which are three types or more even if the components which are necessary for the substrate are three types or more.

As described above, in particular, in the embodiment, it is possible to reduce the time necessary for "set-up change" by the operator which takes up production time in a case of production of a large variety of products in small lots.

Mounting Region Setting Method of Fourth Embodiment

The mounting region setting method according to the embodiment is a method which combines the first to third embodiments. That is, even if the components which are necessary for the substrate are three types or more, either one out of the two mounting regions MA and MB are set as shown in FIGS. 5 and 6. For example, as described above, in a case where the ratio of the numbers of the components a to d which are necessary for the substrate W is 2:3:1:1, the main controller 21 sets by selecting the mounting region MA at the downstream side where the number of components to be supplied is larger out of the mounting regions MA and MB.

Even with a method such as this, it is possible to achieve efficiency of the processing time using a simpler algorithm.

Mounting Region Setting Method of Fifth Embodiment

<First Pattern>

The mounting region setting method according to the first to fourth embodiments are embodiments where the plurality of components which are different are each supplied from a plurality of supply regions. Although not shown, a first pattern in a mounting region setting method according to a fifth embodiment is a pattern where the same component (a plurality of the same components) is supplied from one supply region S. The same component is, for example, a "50 pF condenser" or the like.

Also in this case, the main controller 21 sets the mounting region to a position which is closest to the supply region S in the transport region C according to the disposing of the supply region S. For example, the mounting region M is set so that a predetermined position of the mounting region M in the transport region (for example, the central position of the mounting region M in the transport direction) matches in practice with a position of the supply region S in the transport direction. Alternatively, the mounting region M may be set to the closest position to where the supply region S is disposed out of the two mounting regions MA and MB as in the first embodiment described above.

<Second Pattern>

The second pattern is a pattern where a plurality of the same components is supplied from a plurality of supply regions S. In this case, the main controller 21 sets the mounting region M with the central position between the plurality of supply regions S in the transport direction as the reference. For example, the mounting region M is set so that a predetermined position of the mounting region M in the transport region (for example, the central position of the mounting region M in the transport direction) matches in practice with a position which is the central position between the supply regions S in the transport direction.

Alternatively, the mounting region may be set in a position so that the mounting region M is allotted according to the ratio of the numbers of the components which are taken out from the supply regions S with the central position between the supply regions S in the transport direction as the reference in a case where the plurality of same components are supplied from the plurality of supply regions S. Alternatively, the mounting region M may be set to the closest position to where the central position of the supply regions S is disposed out of the two mounting regions MA and MB as in the first embodiment described above.

As in the fifth embodiment, it is possible to achieve efficiency in the processing time and improve productivity even in a case where the plurality of same components is supplied.

Backup Member of Substrate

Figure 10:
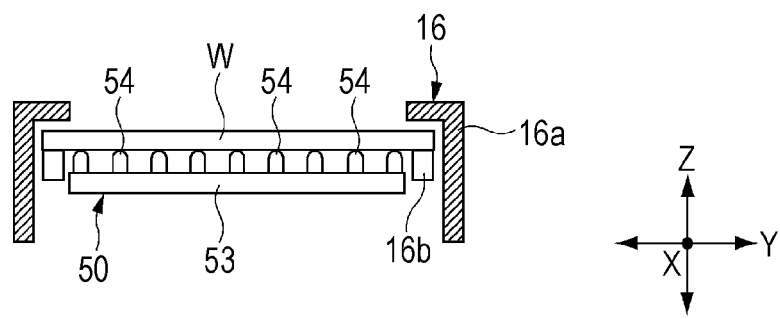
FIG. 10 is a diagram illustrating a transport unit where a backup member which supports a substrate from below is provided.
Figure 11:
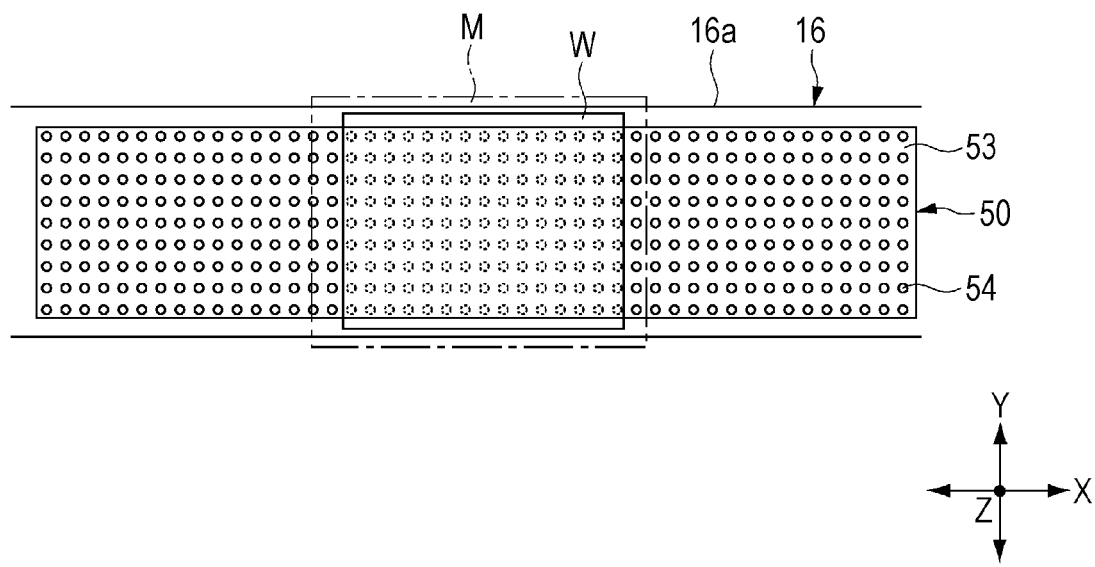
FIG. 11 is a top view illustrating a transport unit where a backup member is provided.

FIG. 10 is a diagram illustrating the transport unit 16 where a backup member which supports the substrate W from below is provided and FIG. 11 is a planar diagram thereof.

A backup member 50 is provided with a plurality of support pins 54 (support sections) which support the substrate W from below and a base plate 53 which integrally supports the support pins 54. At least the support pins 54 are formed from rubber, a sponge material, but a member where a spring or the like is built in may be used as long as the member is able to elastically change shape. The base plate 53 and the support pins 54 may be formed of the same material.

As shown in FIG. 11, the backup member 50 has a longer size than the mounting region M in the transport direction of the substrate W (X axial direction) and is a member which is fixed in the transport direction. For example, the length of the backup member 50 is the same in practice as the length of the transport region C.

The backup member 50 is connected to a raising and lowering structure such as a cylinder which is not shown and is able to be raised and lowered due to this. When the mounting region M is set as in each of the embodiments described above, the backup member 50 is raised and the substrate which is supported by the backup member 50 is raised. The component is mounting on the substrate W using the mounting unit 40 in a state where the backup member 50 is raised and the substrate W is supported.

Here, a member (not shown) which is raised along with the backup member 50 using the raising and lowering structure is also provided and the substrate W is held and raised for each conveyer belt 16b using the member.

The substrate W receives a pressing force from the suction nozzle 33 via the component due to the lowering of the suction nozzle 33 of the mounting head 30 in the instant where the component is mounted using the mounting unit 40.

Here, if there is a case where the support pins 54 are metal pins which do not elastically change shape, there is a concern that a force which is applied to the component and the substrate W is large when the position of the suction nozzles 33 of the mounting head 30 and the position of the metal pins match up in the Z axial direction and the component, the substrate W, the suction nozzles 33, or the like receive mechanical damage. Therefore, there is a necessity for the metal pins to move to an appropriate position where the position of the metal pins and the position of the suction nozzles 33 do not match up in the Z direction for each of the mounting regions M which change as in the present application.

However, due to the support pins 54 which are able to elastically change shape being provided in the present embodiment, it is possible to relieve the force which is applied to the substrate W when mounting using the elastic changing of shape of the support pins 54 even if the position of the support pins 54 and the position of the suction nozzles 33 match up in the Z direction. Then, there is no necessity for the backup member 50 to be moved in the transport direction due to the support pins 54 being disposed over the whole area of the transport region C.

Other Embodiments

The present application is not limited to the embodiments described above and other various embodiments are able to be realized.

In each of the embodiments described above, the main controller 21 sets the mounting region M with the central position p between each of the supply regions S as the reference. However, the reference position may be set in a plurality of locations in the transport direction in advance, the main controller 21 may select one of the reference positions based on the plurality of reference positions which are set in advance, and the mounting region may be set based on the reference position which has been selected. Due to this, the main controller 21 is able to select the reference position where the movement distance of the mounting unit 40 during mounting is the smallest.

In the second embodiment described above, there is setting as shown in FIGS. 7 and 8 where the mounting region M is allotted using the predetermined ratio with the central position p as the reference. However, the mounting region M may not be allotted using the predetermined ratio but the mounting region M may be set so that the center of the mounting region M in the transport direction matches up with the central position p.

The backup member 50 is not limited to the format of being provided over the whole area of the transport region C as shown in FIG. 11. For example, the length of the backup member in the X axial direction may be approximately a length of the mounting region M in the X axial direction. In this case, a structure which moves the backup member in the X axial direction to correspond with the mounting region M which has been set is further provided. Also in this case, there is no problem even if the positions of the support pins and the suction nozzles 33 match up in the Z direction as the support pins are able to elastically change shape. Accordingly, accurate positioning of the backup member corresponding to the mounting region M is not necessary when the backup member is moved.

In a case where the backup member is provided in a portion of the transport region C in the transport direction and in a case where a plurality of the mounting regions M are determined in advance at two or three or the like predetermined positions as in FIG. 5 or the like, a plurality of the backup members may be provided in the transport direction to correspond to this.

Out of the characteristic sections of each of the embodiments which are described above, it is possible for at least two of the characteristic sections to be combined.

It is possible for the present application to be configured as below.

(1) A component mounting device which is provided with a transport unit which has a transport region and transports a substrate in the transport region, a plurality of supply regions which are lined up along the transport direction of the substrate due to the transport unit and are able to supply each component, a control unit which sets a mounting region which is a region where the component is mounted in the transport region of the transport unit according to the disposing of the supply region of the component which is necessary for the substrate out of the plurality of supply regions, and a mounting unit which takes out the component which is necessary for the substrate from at least one supply region out of the plurality of supply regions and performs mounting on the substrate in the mounting region which has been set.

(2) The component mounting device described in (1) where the control unit sets the mounting region according to the disposing of the plurality of supply regions as the supply region of the component which is necessary for the substrate, and the mounting unit mounts the component on the substrate by taking out each component which is necessary for the substrate from the plurality of supply regions.

(3) The component mounting device described in (2) where the control unit further sets the mounting region based on the number of each component which is taken out from each of the plurality of supply regions by the mounting unit.

(4) The component mounting device described in (3) where the control unit sets the position of the mounting region so as to allot such that the mounting region corresponds to the ratio of the number of each component with a central position between the plurality of supply regions in the transport direction as a reference.

(5) The component mounting device described in one out of any of (2) to (4) where the plurality of supply regions supply each of a plurality of components which are different or may supply a plurality of the same components.

(6) The component mounting device described in one out of any of (1) to (5) where there is further provided a backup member which has a support section, which is provided to be able to elastically change shape and which supports the substrate, and which is disposed in the mounting region.

(7) The component mounting device described in (6) where the backup member has a longer size in the transport direction than the mounting region.

(8) A substrate manufacturing method, which uses a component mounting device which is provided with a transport unit which has a transport region and transports a substrate in the transport region and a plurality of supply regions which are lined up along the transport direction of the substrate due to the transport unit and are able to supply each component, including setting a mounting region which is a region where the component is mounted in the transport region of the transport unit according to the disposing of the supply region of the component which is necessary for the substrate out of the plurality of supply regions, and taking out the component which is necessary for the substrate from at least one of the supply regions out of the plurality of supply regions and performing mounting of the component on the substrate in the mounting region which has been set.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A component mounting device comprising:
    a transport unit which has a transport region and transports a substrate in the transport region;
    a plurality of supply regions which are lined up along a transport direction of the substrate due to the transport unit and are able to supply each component, wherein the transport unit is disposed in a central portion of the component mounting device such that the supply regions are disposed on both sides of the transport region;
    a control unit electrically connected to the transport unit;
    a memory device storing instructions which is executed by the control unit, causing the control unit to set a mounting region according to the disposing of the supply region of the component which is necessary for transporting the substrate out of the plurality of supply regions, the mounting region being a region where the component is mounted in the transport region of the transport unit; and
    a mounting unit which takes out the component which is necessary for the substrate from at least one supply region out of the plurality of supply regions and performs mounting the component on the substrate in the mounting region which has been set.

2. The component mounting device according to claim 1, wherein the control unit sets the mounting region according to the disposing of the plurality of supply regions as the supply region of the component which is necessary for the substrate, and
the mounting unit mounts the component on the substrate by taking out each component which is necessary for the substrate from the plurality of supply regions.

3. The component mounting device according to claim 2, wherein the control unit further sets the mounting region based on the number of each component which is taken out from each of the plurality of supply regions by the mounting unit.

4. The component mounting device according to claim 3, wherein the control unit sets the position of the mounting region so as to allot such that the mounting region corresponds to the ratio of the number of each component with a central position between the plurality of supply regions in the transport direction as a reference.

5. The component mounting device according to claim 2, wherein the plurality of supply regions supply each of a plurality of components which are different or supply a plurality of the same components.

6. The component mounting device according to claim 1, further comprising:
a backup member which has a support section, which is provided to be able to elastically change shape and which supports the substrate, and which is disposed in the mounting region.

7. The component mounting device according to claim 6, wherein the backup member has a longer size in the transport direction than the mounting region.

* * * * *